United States Patent [19]

Slootman et al.

[11] Patent Number: 5,523,124

[45] Date of Patent: Jun. 4, 1996

[54] PROCESS FOR PRODUCING A SILICON OXIDE DEPOSIT ON THE SURFACE OF A METALLIC OR METALLIZED POLYMER SUBSTRATE USING CORONA DISCHARGE AT PRESSURES UP TO APPROXIMATELY ATMOSPHERIC

[75] Inventors: Frank Slootman, St Cyr L'Ecole; Pascal Bouard, Draveil, both of France

[73] Assignee: L'Air Liquide, Societe Anonyme pour l'Etude et l'Expoloitation des Procedes Georges Claude, Paris, France

[21] Appl. No.: 402,330

[22] Filed: Mar. 10, 1995

Related U.S. Application Data

[63] Continuation of Ser. No. 77,517, Jun. 17, 1993, abandoned.

[30] Foreign Application Priority Data

Jun. 17, 1992 [FR] France .................................. 92 07377

[51] Int. Cl.⁶ .................................................. B32B 21/06
[52] U.S. Cl. .......................... 427/534; 427/535; 427/536; 427/537; 427/539; 427/574; 427/579
[58] Field of Search ...................... 427/534, 535, 427/536, 537, 539, 574, 579

[56] References Cited

U.S. PATENT DOCUMENTS

| | | | |
|---|---|---|---|
| 3,655,438 | 4/1972 | Sterling et al. | 427/579 |
| 4,792,460 | 12/1988 | Chu et al. | 427/574 |
| 4,869,929 | 9/1989 | Cabrera et al. | 427/248.1 |
| 5,185,132 | 2/1993 | Horiike et al. | 422/186.05 |
| 5,225,659 | 7/1993 | Kusano et al. | 249/121.59 |
| 5,275,665 | 1/1994 | Okazaki et al. | 118/723 E |
| 5,319,247 | 6/1994 | Matsuura | 257/760 |

FOREIGN PATENT DOCUMENTS

| | | | |
|---|---|---|---|
| 0097334 | 1/1984 | European Pat. Off. . | |
| 0199307 | 10/1986 | European Pat. Off. . | |
| 0289601 | 11/1988 | European Pat. Off. . | |
| 0353060 | 1/1990 | European Pat. Off. . | |
| 0446988 | 9/1991 | European Pat. Off. . | |
| 0513634 | 11/1992 | European Pat. Off. | 427/578 |
| 275264 | 1/1990 | Germany | 427/574 |
| 52-58854 | 5/1977 | Japan . | |
| 62-156943 | 7/1987 | Japan . | |
| 63-69958 | 3/1988 | Japan | 427/535 |
| 3-143930 | 6/1991 | Japan . | |
| 3-229886 | 10/1991 | Japan . | |
| 4-374 | 1/1992 | Japan . | |
| 2104054 | 3/1983 | United Kingdom . | |
| 2107360 | 4/1983 | United Kingdom . | |

OTHER PUBLICATIONS

Bunshah, R. F. et al., *Deposition Technologies for Films and Coatings*, Noyes Publications (1982) p. 506.

*Primary Examiner*—Benjamin Utech
*Attorney, Agent, or Firm*—Browdy and Neimark

[57] ABSTRACT

A process for producing a silicon oxide deposit at the surface of a metallic substrate comprising the following steps performed either concomitantly or successively: (1) treating the surface of the substrate with a corona discharge; and (2) exposing the surface to an atmosphere containing a silicon compound in the gaseous state. Both steps (1) and (2) are conducted at a pressure greater than 10,000 Pa. This process can be used to provide anti-corrosion treatment to a metallic substrate or to a metallized polymeric support.

12 Claims, No Drawings

PROCESS FOR PRODUCING A SILICON OXIDE DEPOSIT ON THE SURFACE OF A METALLIC OR METALLIZED POLYMER SUBSTRATE USING CORONA DISCHARGE AT PRESSURES UP TO APPROXIMATELY ATMOSPHERIC

This application is a continuation of application Ser. No. 08/077,517, filed Jun. 17, 1993, now abandoned.

BACKGROUND OF THE INVENTION a) Field of the Invention

The present invention concerns a process for producing a silicon containing deposit at a surface of a metallic substrate, a process for providing an anti-corrosive treatment to such a metallic substrate, and a metallized polymer support including a silicon containing deposit.

b) Description of Prior Art

It is known that metallic substrate, for example metallic sheets or strips of small thicknesses are often sensitive to corrosion, which may be induced by water or water vapor.

A number of processes have already been designed in order to decrease these risks; of corrosion. Thus, it has already been proposed to deposit silicon at the surface of these substrates, silicon having properties defining a barrier against water vapor. Moreover, a deposit of silicon enables to improve the properties of adhesion and wettability of these substrates. The processes used to achieve this rely on plasma or pyrolytic techniques. However, the plasma techniques used to this date require the use of low or very low pressures resulting in prohibitive costs. Moreover, the deposit of silicon may only be carried out on small surfaces, of the order of 100 cm$^2$ (10×10 cm$^2$). This technique is therefore not adapted for substrates with very large surfaces, such as sheets. A similar problem is also present for the treatment of metallized polymer films having large surfaces. These films are for example intended for the manufacture of electrical condensers and are used in field of packaging. They are made of a polymer film such as a polyolefin or a polyester in which the surface is metallized with a metallic film or deposit which consists of a pure or alloyed metal, and in which the thickness is very small, generally lower than 25 nanometers.

In view of their small thicknesses, these films are very sensitive to corrosion, because the metallic part may be substantially removed after a few hours of contact with water vapor.

The pyrolytic techniques mentioned above, require the use of elevated temperatures. If such temperatures may in certain cases be acceptable for metallic sheets, they are however much higher than the melting temperatures of the polymers which constitute said metallic films.

The pyrolytic techniques are therefore completely useless for treating these films.

It is therefore a main object of the present invention to provide a process which can to produce a silicon containing deposit at the surface of a metallic substrates in order to improve for example its corrosion resistance, and its adhesion and wettability properties. This process makes it possible to obtain a deposit on substrates having large surfaces. It does not require the use of low pressure or high temperatures, which are not compatible with substrates of the metallized polymer film type.

SUMMARY OF THE INVENTION

The invention thus concerns a process for producing a silicon containing deposit at the surface of a metallic substrate characterized in that it comprises, concomitantly or successively, the following steps:

(1) said surface is treated with an electrical discharge with dielectric barrier, (2) said surface is exposed to an atmosphere containing a silicon compound in gaseous state, steps (1) and (2) being carried out at a pressure higher than 10,000 Pa.

Advantageously, at least step (1) is carried out at a pressure between 50,000 and 120,000 Pa, preferably at atmospheric pressure.

The treatment by electrical discharge with dielectric barrier carried out during the step, is well known per se. It consists in producing an electrical discharge between at least one electrode and one counter-electrode. The electrode, and possibly the counter-electrode, is covered with a dielectric material, such as glass, an elastomer, a ceramic material, alumina or silica. Such a treatment may for example consists in a luminescent discharge or "silent glow discharge", or in a preferred manner, within the frame work of the present invention, of a corona discharge.

The treatment by corona discharge is a treatment well known per se, c.f. for example the article "The Flexible Adaptation of the Effective Contact Surface " of E. Prinz which appeared in "Plastics Southern Africa", June 1983, pages 50 and following, and the article "Treatment by Corona Effect, Technical Considerations on the Equipment " of G. Tuffin, which appeared in "Plastiques Modernes et Elastomeres", May 1977, pages 54–56, which give indications on the material to be used and the operating conditions.

Steps (1) and (2) described above may be carried out concomitantly by providing an atmosphere including the silicon compound in gaseous state in the zone where said surface is treated with an electrical discharge with dielectric barrier.

Steps (1) and (2) may also be carried out successively in time, step (1) being carried out in a gas containing oxygen, such as air, an inert gas such as nitrogen, argon or helium, or a mixture of these gases. Step (2) may then be carried out by exposing the surface of the substrate to an atmosphere containing the compound of silicon in gaseous state, said atmosphere being present in a zone following the zone where step (1) is carried out.

The atmosphere containing the compound of silicon in gaseous state which is used when carrying out steps (1) and (2) concomitantly, or in step (2) when steps (1) and (2) are carried out successively, additionally includes generally at least one inert gas such as nitrogen, argon or helium. For example, a compound of silicon in gaseous state which is diluted in a mixture of nitrogen and argon may be used.

Usually, the content of the silicon compound in gaseous state in said atmosphere is between 0.01 and 5% by volume, preferably between 0.1 and 2% by volume. The presence of low amount of oxygen in the atmosphere containing the compound of silicon in gaseous state may be tolerated under certain conditions. The amount of oxygen should course be lower than the limit of flammability of the gas mixture containing the compound of silicon.

Generally, this amount is lower than 5% by volume, preferably lower than 2% by volume with respect to the total volume of the gas mixture. For treating certain substrates, such as metallized polymer films, the amount of oxygen will be as low as possible, preferably null or nearly null.

The temperature used during steps (1) and (2) should be lower than the melting temperature of the substrate. Usually, the temperature used is comprised between 0 and 80° C., and preferably is the room temperature, i.e. a temperature of about 0 to 35° C.

The time of contact between the surface of the substrate treated with the electrical discharge with dielectric barrier and the atmosphere containing the compound of silicon in gaseous state is not critical. It may for example be selected depending on the desired thickness of the deposit containing silicon. Normally, the time of contact is between $10^{-3}$ second and 1 minute.

The compound of silicon in gaseous state may be a compound which is gaseous at atmospheric pressure and room temperature. However it may also be a compound which is a solid or liquid under these same conditions of pressure and temperature, which is then vaporized.

A compound of silicon which may be used within the frame work of the present invention may include linear or branched silicon hydrides of formula $Si_nH_{2n+2}$, where n represents a number between 1 and 4, such as monosilane ($SiH_4$), disilane or trisilane, halogenated silicon hydrides such as $SiCl_4$, $SiH_2Cl_2$, $SiH_3Cl$ or $SiHCl_3$, alkoxysilanes such as tetraethoxysilane, or organosiloxanes. Monosilane ($SiH_4$) is a preferred compound of silicon within the framework of the present invention.

The nature of said silicon containing deposit obtained by the process according to the invention may vary for example depending on the nature of the substrate, the nature of the compound of silicon in gaseous state and the presence or absence of oxygen during the process. This deposit may consist of silicon dioxide $SiO_2$ or an oxide of silicon which is sub-stoichiometric in oxygen. The silicon may also be deposited at the surface of the metallic substrate and migrate thereto so as to form an alloy of silicon and of the metal or metals which constitute said substrates. The deposit containing silicon may for example be in the form of a film..

The metallic substrate treated according to the process of the invention may be of any metal which may be corroded, in particular with water, water vapor, or oxygen. For example, it may consist of iron, nickel, zinc, aluminum, copper, silver or an alloy containing at least one of these metals such as an alloy of silver and zinc or a steel.

The substrate may be in the form of a sheet or a strip in which the thickness may be lower than about 5 mm.

The substrate may also consist of a polymer support which is metallized with a metallic film or a metallic deposit, steps (1) and (2) being carried out at the free surface of the film metallic or of the metallic deposit; the latter may generally have a thickness lower than 25 nanometers. Said support may for example be in the form of a metallized polymer film, where the thickness of the polymer film may be lower than about 250 μm, preferably comprised between 6 and 40 μm and more generally between 10 and 40 μm. Polymers which may constitute such a support, may include polyolefins such as polyethylene or polypropylene; polyesters, polyamides, polycarbonates or vinyl polychloride. Such metallized polymer substrates may be obtained by known methods, such as vacuum evaporation.

According to another aspect of the invention, the latter also concerns a process for an anti-corrosive treatment of a metallic substrate, such as a metallic sheet or a polymer support which is metallized with a metallic film or a metallic deposit characterized in that a film containing silicon is deposited at the metallic surface of said substrate by using, concomitantly or successively, the following steps:

(1) said surface is exposed to an electrical discharge with dielectric barrier, (2) said surface is exposed to an atmosphere containing a compound of silicon in gaseous state; steps (1) and (2) being carried out at a pressure higher than 10,000 Pa.

The invention also concerns a polymer support which is metallized with a metallic film or deposit in which the free surface includes a deposit consisting of silicon dioxide or an oxide of silicon which is sub-stoichiometric in oxygen. Such a metallized polymer support may be prepared by the process described above. On the other hand, the characteristics and the nature of the polymer support and of the film or metallic deposit may be such as defined above.

DESCRIPTION OF PREFERRED EMBODIMENT

The non limiting example which follows is intended to illustrate the present invention.

EXAMPLE

A PET (polyethylene terephthalate) ribbon, 12 μm thick and 10 cm wide, which is metallized with an alloy of silver and zinc by a technique of deposit under vacuum, was treated by means of a device for treating by corona discharge, by continuously passing it between the electrode and the counter-electrode of said device. A voltage of about 6000 volts was applied between the electrodes, the frequency being correspondingly adapted between about 20 and 25 KHz. The electrode, disposed above the ribbon was made of a tube of alumina surrounding a metallic core.

The counter-electrode was flat and served as support to the unwinding of the ribbon. The space between the electrodes was about 2 mm.

The electrode and the counter-electrode were disposed in an enclosure in which there was introduced a gas mixture consisting of 99% in volume of argon and 1% in volume of silane, at a flow rate of 3 l/min.

The speed of unwinding said ribbon between the electrode and the counter-electrode was 5 m/min.

In order to appreciate the resistance against corrosion of the metallized PET ribbon thus treated, it was exposed to an atmosphere which was saturated with water vapor, during 3 days at room temperature.

The degree of corrosion was then measured by projecting a light beam through the ribbon. The light transmission measured was 2%.

By way of comparison, for a same metallized PET ribbon, which is not treated by the process according to the invention and is subject to the same test of corrosion, the light transmission was 98%, which indicates a considerable loss of the metallic film which is present at the surface of the PET ribbon.

We claim:

1. Process for producing a silicon oxide deposit at the surface of a metallic substrate comprising the following steps:

a) providing an atmosphere comprising a silane of general formula $Si_nH_{2n+2}$, where n represents a number between 1 and 4, in a zone where a corona discharge has been established, at a pressure higher than 10,000 Pa;

b) exposing said surface, inside said zone, to said atmosphere and said corona discharge.

2. Process according to claim 1, wherein said pressure is between 50,000 and 120,000 Pa.

3. Process according to claim 1, wherein the amount of silane in said atmosphere is between 0.01 and 5% vol.

4. Process according to claim 1, wherein said substrate is made of iron, nickel, zinc, aluminum, copper, silver, or an alloy containing at least one of these metals.

5. Process according to claim 1, wherein said substrate is a polymer support which is metallized, the polymer support comprising a polyolefin, a polyester, a polyamide, a polycarbonate or a polyvinyl chloride.

6. Process for producing a silicon oxide deposit at the surface of a metallic substrate comprising the following steps:
   a) providing a first atmosphere comprising oxygen and at least one inert gas selected from the group consisting of $N_2$, Ar and He, and being free from any compound of silicon, to a first zone where a corona discharge has been established,
   b) exposing said surface, inside said first zone, to said first atmosphere and corona discharge,
   c) directing said substrate to a second zone, where has been provided a second atmosphere comprising a silane of general formula $Si_nH_{2n+2}$, where n represents a number between 1 and 4, and
   d) exposing said surface, inside said second zone, to said second atmosphere,
   the pressure inside said first zone and said second zone being higher than 10,000 Pa.

7. Process according to claim 6, wherein said pressure, inside said first and second zones, is between 50,000 and 120,000 Pa.

8. Process according to claim 6, wherein the amount of silane in said second atmosphere is between 0.01 and 5% vol.

9. Process according to claim 6, wherein said substrate is made of iron, nickel, zinc, aluminum, copper, silver, or an alloy containing at least one of these metals.

10. Process according to claim 6, wherein said substrate is a polymer support which is metallized, the polymer support comprising a polyolefin, a polyester, a polyamide, a polycarbonate or a polyvinyl chloride.

11. A process for producing an anti-corrosion coating on a metallic substrate comprising:
   (a) providing an atmosphere comprising a silane of the general formula $Si_nH_{2n+2}$, wherein n represents a number between 1 and 4, in a zone in which a corona discharge has been established, at a pressure higher than 10,000 Pa;
   (b) exposing said surface, inside said zone, to said atmosphere and said corona discharge.

12. A process for producing an anti-corrosion coating on a metallic substrate comprising:
   (a) providing a first atmosphere comprising oxygen and at least one inert gas selected from the group consisting of nitrogen, argon and helium, and being free from an silicon compound, to a first zone in which a corona discharge has been established;
   (b) exposing said surface, inside said first zone, to said first atmosphere and said corona discharge;
   (c) directing said substrata to a second zone in which is provided a second atmosphere comprising a silane of the general formula $Si_nH_{2n+2}$, wherein n represents a number between 1 and 4; and
   (d) exposing said surface, inside said second zone, to said second atmosphere,
   the pressure inside said first zone and said second zone being higher than 10,000 Pa.

* * * * *